United States Patent [19]

Douglas

[11] Patent Number: 5,000,820

[45] Date of Patent: Mar. 19, 1991

[54] METHODS AND APPARATUS FOR ETCHING MERCURY CADMIUM TELLURIDE

[75] Inventor: Monte A. Douglas, Dallas, Tex.

[73] Assignee: Texas Instrument Incorporated, Dallas, Tex.

[21] Appl. No.: 453,521

[22] Filed: Dec. 20, 1989

[51] Int. Cl.$^5$ .................... H01L 21/306; B44C 1/22; C23F 1/02; C09K 13/00

[52] U.S. Cl. .................................. 156/643; 156/635; 156/646; 156/656; 156/659.1; 156/662; 204/192.35; 252/79.1; 437/228

[58] Field of Search .............. 156/635, 643, 646, 655, 156/656, 659.1, 662; 204/192.32, 192.35, 298; 252/79.1; 427/38, 39; 437/228, 234

[56] References Cited

U.S. PATENT DOCUMENTS 4,822,450 4/1989 Davis et al. ...................... 156/643

OTHER PUBLICATIONS

Plasma Quest, inc., Innovative Solutions Using Plasma Technologies, *Plasma Quest*, Feb. 12, 1988.
Plasma Quest/Free Radical Reactor, Innovative Solutions Using Plasma Technologies, *Plasma Quest*, Feb. 12, 1988.
Haag et al., "Etching of Metals by Means of Organic Radicals", Plasma Chemistry and Plasma Processing, vol. 6, No. 3, 1986, pp. 197-202.
Morrison et al., *Organic Chemistry*, Third Edition, Jul., 1976, "Coupling of Alkyl Halides with Organometallic Compound", Sec. 3.17, pp. 92-93.

Primary Examiner—William A. Powell

[57] ABSTRACT

A workpiece (W) is placed within a reaction chamber (12). The chamber (12) is evacuated (18) to a relatively low pressure such as 10 torr. An organic or nitrogen-based free radical precursor compound (36) is introduced into the reactor (12). A volume of the chamber (12) adjacent to the workpiece (W) is illuminated (28) with energy made up of one or more wavelengths in the range of about 200 to about 1300 nanometers such that an exposed surface (23) of the layer is illuminated (28). The free radical precursor compound is photodissociated in response to the illumination. Resulting free radicals are reacted with the exposed surface (23) of the workpiece (W) to create volatile compounds, which are removed from the chamber through a vacuum source (18).

35 Claims, 1 Drawing Sheet

METHODS AND APPARATUS FOR ETCHING MERCURY CADMIUM TELLURIDE

TECHNICAL FIELD OF THE INVENTION

The present invention relates in general to etching techniques, and more particularly to methods and apparatus for etching mercury cadmium telluride.

BACKGROUND OF THE INVENTION

Mercury cadmium telluride (HcCdTe) has found use as a semiconductor in such applications as forward-looking infrared (FLIR) receptors. In conjunction with this, an interest has developed in fabricating integrated circuits in layers of mercury cadmium telluride, the fabricating techniques including etching processes.

Mercury cadmium telluride is a very fragile material. It cannot take much stress mechanically, and, in order to avoid dislocations and fusion, needs to be kept at temperatures below 100° C. Highly energetic etching processes, such as plasma or afterglow discharges, may not be used on mercury cadmium telluride surfaces in the way that they are used on more sturdy semiconductor materials such as silicon.

The etching of metals by organic radicals has been studied. As early as 1929, Paneth proved the existence of organic free radicals in pyrolytic experiments by their reaction on metallic mirrors of lead, antimony, zinc and bismuth. F. Paneth and W. Hofeditz, *Chem. Ber.* 62, 1335; Paneth F. and H. Loleit, *J. Chem. Soc.* 366 (1935). C. Haag and H. Suhr have reported the etching of indium, germanium, tin, lead, antimony, bismuth and zinc by methyl radicals and partially by phenyl radicals in *Plasma Chemistry and Plasma Processing*, Vol. 6, p. 197 (1986). However, the application of organic free radicals as etchant species to workpieces or layers of mercury cadmium telluride is not straightforward, because of the above-described fragility and temperature problems of this material in energetic environments. A need has therefore arisen to create organic free radicals for etching a surface of mercury cadmium telluride in such a way that the mercury cadmium telluride workpiece will not be unduly stressed, but which at the same time will result in a useful etching process.

SUMMARY OF THE INVENTION

The present invention comprises methods and apparatus for etching layers of mercury cadmium telluride, or other metallic, semiconductor or metallic-semiconductor compounds forming volatile organometallic compounds. According to one embodiment of the invention, an organic free radical precursor compound, such as an organohalide, is photodissociated to produce an organic free radical. The organic free radical is then reacted with an exposed surface of a mercury cadmium telluride workpiece to form a volatile compound $R_aM_b$ where M is selected from the group consisting of mercury, cadmium, tellurium and mixtures thereof, R is an organo group and a and b are whole numbers. The volatile compound $R_aM_b$ is subsequently removed as by a vacuum source.

In another embodiment of the invention, a nitro-based free radical precursor compound is substituted for the above-described organic free radical precursor compound. This nitro-based free radical precursor compound may take the form of $NA^xB^y$, where A and B are non-nitrogen atoms or groups and the absolute value of x plus y (representing respective oxidation states) is equal to three. Preferably, the nitro-based compound is an amine where A is hydrogen and B is a group that is split from the compound in the formation of the free radical. $B^y$ may, for example, be a halogen or a carboxyl group.

According to another embodiment of the invention, a workpiece, including a metallic layer that is desired to be etched, is provided wherein the layer comprises one or more metals forming volatile organometallic compounds. The workpiece is placed in a reaction chamber. The reaction chamber is evacuated. Halogen radicals are remotely manufactured. Next, these halogen radicals and a gaseous organic compound are introduced into the reaction chamber. In response to the introduction of the halogen radicals and the gaseous organic compound, organic free radicals are created. The organic free radicals are reacted with an exposed surface of the metallic layer to form at least one volatile organometallic compound, which organo-metallic compound is removed from the reaction chamber.

It is preferred that the reaction chamber in this embodiment include an orthogonal light source for illuminating the workpiece as is present in the embodiment first described. This will produce a desired etch anisotropy. Orthogonal illumination of the workpiece drives the reaction to its products and will cause desorption of the product only in regions where the light strikes.

The present invention has significant technical advantages in that it creates organic free radicals that are efficacious in the etching of mercury cadmium telluride and other metal or semiconductor surfaces, while at the same time avoiding the exposure of these sometimes fragile or heat damage-prone surfaces to unduly hostile environments. A further technical advantage is the anisotropic etching that results from the use of light to drive the reaction, unlike wet etching or remote radical production by itself. The invention has the additional technical advantage of a much lower methylene polymerization rate and hence fewer defect particles on the workpiece. Industrially useful processes for etching mercury cadmium telluride and other semiconductor materials result.

BRIEF DESCRIPTION OF THE DRAWINGS

Further aspects of the invention and their advantages will be discerned by studing the following detailed description, when taken in conjunction with the drawings, in which.

DETAILED DESCRIPTION OF THE INVENTION

Figure 1:
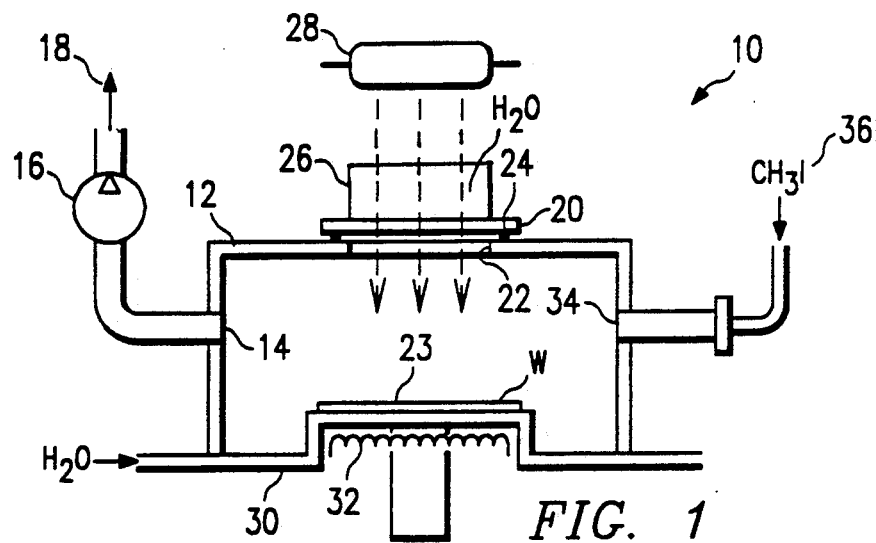
FIG. 1 is a schematic diagram of an etching system including a photoreaction chamber, according to a first embodiment of the invention.

In FIG. 1, a mercury cadmium telluride photochemical etching system is indicated generally at 10. The system 10 includes a reactor chamber 12 into which a workpiece W of mercury cadmium telluride has been placed. While the invention is described in conjunction with mercury cadmium telluride throughout this detailed description, the invention is also useful for etching other metallic or semiconductor species. For example, other metallic or semiconductor layers that could be etched according to the invention may be comprised of silicon, iron, copper, gold, sodium, arsenic, gallium, arsenide, antimony, zinc, potassium, iridium, and lanthanum. The present invention is, in general, useful for etching the surface of any metal or semiconductor that forms volatile organometallic compounds by reacting with organic (or nitro-based) free radicals. The workpiece W may, for example, be a layer of mercury cadmium telluride on a sapphire substrate.

A port 14 and a valve 16 communicate the interior of the reactor 12 with a vacuum source 18. The vacuum source 18 is used to evacuate the interior of reactor 12 to a low pressure in the range of 0.001 to 1000 torr. An interior pressure of 10 torr has been used with success.

A transparent window 20, which for example may be fabricated of quartz, is fitted over a relatively large opening 22 for the admission of light into the interior of the chamber. The window 20 and the opening 22 should be sized such that an entire surface area 23 of the workpiece W can be illuminated. The window 20 may be sealed over the opening 22 with an O-ring 24 or the like.

A water filter 26 is positioned on top of the quartz window 20 such that all of the light illuminating the surface of workpiece W passes through it. The water filter 26 may, for example, be a cylinderical quartz or glass container filled with distilled water to a depth of at least 75 millimeters. The water acts to filter out infrared radiation that is harmful to the workpiece W. The wavelengths capable of passing through the water filter 26 exist within a waveband from 185 nanometers to 1.3 microns. This includes light in the near infrared, visible and much of the ultraviolet portion of the spectrum.

A light source 28 is positioned above the water filter 26. The light source 28 may, for example, consist of an Oriel light source, or other mercury arc lamp that emits a wavelength around 450 nanometers. This wavelength is desirable as it does not cause the photodissociation of certain volatile organometallic compounds, as will be discussed below.

Because of its thermal sensitivity, the temperature of the workpiece W is carefully controlled. This can be done, for example, by a water coolant line 30 for cooling the workpiece W and a heating coil 32 for elevating the temperature of the workpiece W. The coolant line 30 and the heating coil 32 may be controlled, for example, by appropriate relays and a thermostat (not shown) to regulate the workpiece W to a predetermined temperature range that should be significantly less than 100° C., and preferably about 50° C.

A port 34 opening on the interior of chamber 12 is connected to a source 36 of a gaseous organic radical precursor compound. The precursor compound must be capable of photodissociating one or more low molecular weight gaseous organic free radicals, such as aliphatic groups in the $C_1$–$C_4$ range or phenyl groups. Examples include tetramethylsilane, methyl, ethyl or propyl halides, and phenyl halides. The precursor compound may be one or more organo groups bound to an inorganic center having one or more atoms of boron, aluminum, phosphorus or silicon. A preferred class of organic radical precursor compounds is the organic halides, methyl iodide ($CH_3I$) being particularly preferred.

In a related embodiment, an nitro-based free radical precursor compound may be substituted for the organic free radical precursor compound. This precursor compound would take the formula $NA^xB^y$, where the superscripts denote oxidation states and where $|x+y|=3$. Such a nitro-based chemistry can, for example, be amine-based and of the formula $NH_aR_b$, where $a+b$ is equal to three. In these nitro-based chemistries, the nitrogen center will have a behavior that is similar to the carbon center in the organic free radical precursor compounds. Outside of amine-based free radical precursor compounds, other nitro-based precursor compounds include nitrosyl chloride. The R in the amine-based chemistry can be an organo group or any other bonding atom or group such as hydrazine or ammonia. The R in the amine-based chemistry can also be a halogen.

In operation, the surface 23 of the workpiece W is prepared such that a clean unoxided mercury cadmium telluride (or other metal) surface is presented to the etchant species. The organic radical precursor compound is introduced into the reactor 12 through the port 34. The light source 28, as filtered by the water filter 26, floods the volume above the workpiece W with light having a wavelength of about 450 nanometers. The action of light on the organic radical precursor compound causes the compound's dissociation, with the subsequent production of one or more organic free radicals per precursor compound molecule.

As dissociated, the organic free radicals are then free to react with the surface of workpiece W to create one or more volatile organometallic compounds that are removed through port 14.

As using methyl iodide as the organic radical precursor compound, it has been discovered that the light from source 28 must not be parallel to the surface 23 of the workpiece W. It has been found that illumination of the chamber with a light that is parallel to the surface of the workpiece W fails to produce an etch of the mercury cadmium telluride surface, while illuminating the chamber such that the light impinges on the surface 23 of workpiece W at a substantially perpendicular angle allows the etch to proceed. It is theorized that methyl iodide dissociates into methyl free radicals and iodine free radicals, and that the iodine free radicals combine with available metallic or semiconductor bonding sites on the surface 23 of the workpiece W. It is thought that light incident on the surface 23 of the workpiece W frees potential bonding sites from iodine, allowing their combination with the methyl free radical.

Light perpendicular to the surface of the workpiece W may also activate the reactant-surface complex to overcome an energy of activation needed to form the product species according to the following reaction pathway:

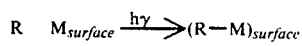

The dashed line in the above reaction indicates a weak bond. Moreover, the introduced light may also cause a photoinduced desorption of the organometallic compound from the surface:

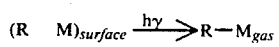

The filtering out of infrared light stops the resultant organometallic compounds from being photodissociated by exciting a vibrational mode.

An important consequence of a projecting light orthogonally to the workpiece is to induce a reaction or etching that is directional or anisotropic. The reaction with, or etching of, the workpiece is directed along the light beam direction, so that the sidewalls of the material under the masked region is not etched, since the light beam is parallel to the sidewall surface. In the prior art, many metals, including HgCdTe, are etched with wet solutions, resulting in isotropic etching.

Another advantage of using light as a dissociating agent is to extend the life of the resultant organometallic compounds. Organometallic species are in many cases not particularly stable in energetic environments such as those including heat, radiation, ions, etc. For example, dimethylcadmium, $(CH_3)_2Cd$, will dissociate when illuminated with a light source having a wavelength of less than or about 300 nanometers. This problem is avoided by keeping the wavelength of the light used well toward the middle of the visible range, such as around 450 nanometers.

Figure 2:
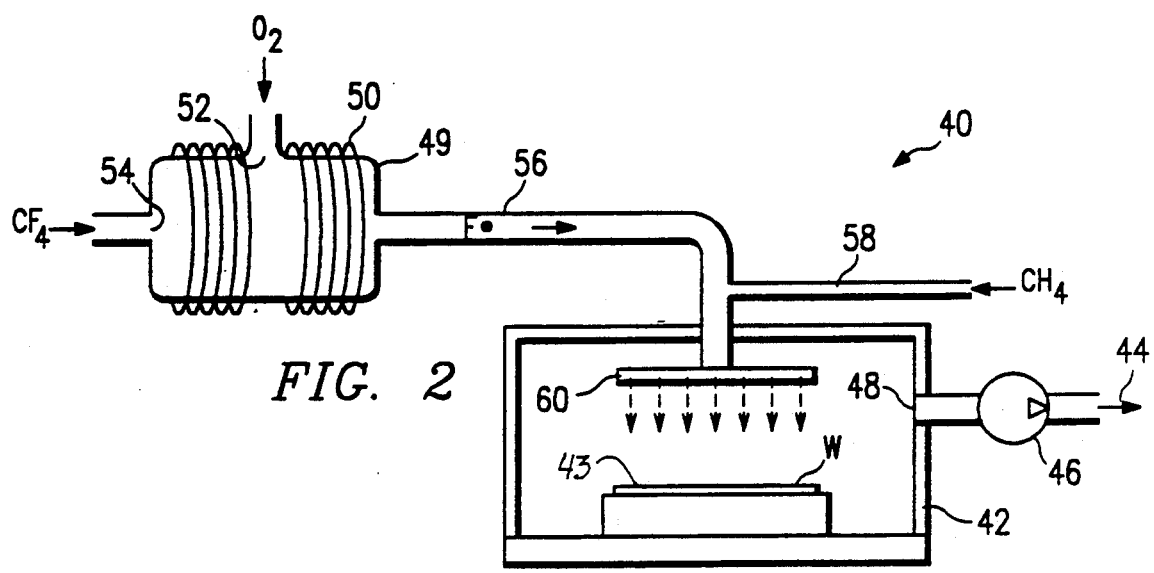
FIG. 2 is a schematic diagram of a system including a remote reactor for producing halogen free radicals, as connected to a primary reaction chamber for etching mercury cadmium telluride and like surfaces.

Turning now to FIG. 2, a second system, indicated generally at 40, may instead be used for etching mercury cadmium telluride surfaces according to the invention. System 40 includes a reaction chamber 42 in which a workpiece W having an exposed mercury cadmium telluride surface 43 is placed. A vacuum source 44 is connected to the interior of the reaction chamber 42 through a valve 46 and a port 48 opening on the interior of the reaction chamber 42.

A halogen radical is prepared in a secondary reactor 49. The vessel 49 has a coil 50 wrapped around it that is connected to a radio frequency generator (not shown). Microwave energy may be used instead of the RF coil 50 shown. A port 52 of reactor 49 is provided for the introduction of oxygen or other free radical promoter, and another port 54 of reactor 49 is provided for the introduction of a halogen-bearing gaseous compound such as sulphur hexafluoride or tetrafluoromethane. The oxygen and the halogen-bearing gas are mixed at low pressure under an RF discharge within vessel 48 to produce halogen free radicals. These radicals, such as fluorine radicals, exit through a line 56.

A line 58 introduces methane into the line 56 slightly above or within a gas discharge head 60. Mixing the methane with fluorine free radicals produces methyl free radicals $(CH_3\cdot)$ which then are used to react with the mercury cadmium telluride surface 43 of workpiece W. The methyl free radicals combine with the mercury, cadmium and tellurium at the surface of the workpiece W to form dimethylcadmium, dimethylmercury and dimethyltellurium. These organometallic compounds are volatile and are drawn off through port 48 by vacuum source 44.

While fluorine radicals are shown in the illustrated embodiment in FIG. 2, other species may be substituted that will react with methane to form organic free radicals. Such species may include other halogens, silicon, boron, aluminum or phosphorus free radicals. Further, while methane is shown as the preferred organic free radical precursor compound, other precursor compounds such as light molecular weight aliphatic compounds or aromatics may be used. The embodiment as illustrated in FIG. 2 has the disadvantage of creating fluorine radicals, and then methyl free radicals, with the coproduction of methylene $(CH_2)$ radicals. Methylene quickly polymerizes and produces an undesirable coating on surfaces within the reactor.

The embodiment as shown in FIG. 2 has the additional disadvantage of not being anisotropic such that no etch directionality may be obtained. However, modifying the chamber 42 by including a 185 nanometer to 1.3 micron light source for illumination of the Workpiece producing an anisotropic etch wherein the vertical etch rate will be much greater than any horizontal or undercutting etch rate.

EXAMPLE

A workpiece was prepared by forming a mercury cadmium telluride surface on sapphire. Prior to the etching step, the slice was dipped in a bromine/methanol solution for five seconds and then rinsed with methanol to remove any oxide which may have formed on the surface of the mercury cadmium telluride. After the cleanup step but before the actual etching step, the workpiece had a layer of photoresist selectively applied to it such that certain areas of the mercury cadmium telluride surface were exposed and others were not. The surface was then cleaned with a bromine/methanol solution prior to photoetching.

The workpiece was then placed within a reaction chamber like that schematically illustrated in FIG. 1. A 1000-Watt Oriel arc light source illuminated the surface of the sample, as filtered by 75 millimeters of distilled water. The interior of the chamber was evacuated to approximately 10 torr. Methyl iodide was introduced into the chamber for ten minutes with a flow rate of 100 sccm where the interior of the reaction chamber was approximately 30 liters. The temperature of the workpiece W was held at approximately 50° C.

Figure 3:
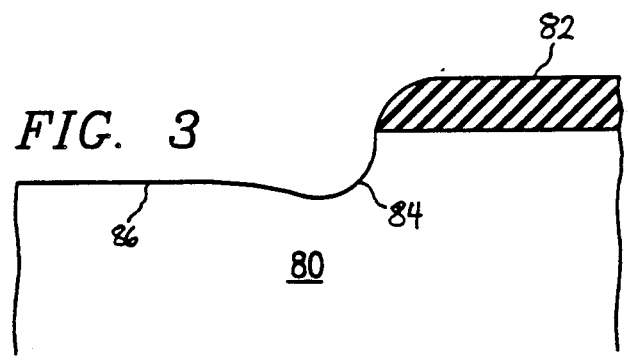
FIG. 3 is a highly enlarged schematic sectional view of a mercury cadmium telluride layer as partially covered with photoresist, showing a resultant etching profile.

The result of this process is schematically illustrated by a highly magnified sectional view shown in FIG. 3. The mercury cadmium telluride layer is indicated at 80, while the photoresist remaining after the etching step is shown at 82. Approximately 0.5 microns of mercury cadmium telluride material was removed by this etching process. The etching appears to be more active near the boundary of the photoresist, producing a slight depression 84 in relation to the remainder of the etched surface 86. The etch rate was approximately 250 angstroms per minute. It is theorized that the etch rate is faster at photoresist edges because the resist contributes organic radical groups as etchant species.

In summary, novel methods and apparatus have been disclosed for successfully etching mercury cadmium telluride surfaces, and other metal or semiconductor surfaces that form volatile organometallic compounds, in nonenergetic environments. While preferred embodiments of the invention and their advantages have been described in the above detailed description, the invention is not limited thereto but only by the scope and spirit of the appended claims.

What is claimed is:

1. A method for etching a layer on a workpiece, comprising the steps of:
   photodissociating an organic free radical precursor compound to produce at least one gaseous organic free radical;
   reacting the organic free radical with an exposed surface of the layer to form a volatile organic compound; and
   removing the volatile compound.

2. The method of claim 1, and further comprising the step of photodissociating the organic free radical precursor compound with energy selected from the wavelength range of about 185 to about 1,300 nanometers.

3. The method of claim 1, and further comprising the step of maintaining the temperature of the workpiece at less than 100° C.

4. The method of claim 1, wherein said step of photodissociating comprises the step of selecting a photodissociating energy to have a wavelength which will not dissociate the volatile organic compound.

5. A method for etching a metallic layer on a workpiece wherein the layer comprises one or more metals forming volatile organometallic compounds, comprising the steps of:
   placing the workpiece in a reaction chamber;
   evacuating the reaction chamber to a low pressure;
   remotely manufacturing halogen free radicals;
   reacting the halogen free radicals with a gaseous organic precursor compound to create organic free radicals;
   reacting the organic free radicals with an exposed surface of the metallic layer to form at least one volatile organometallic compound; and
   removing the volatile organometallic compound from the layer.

6. The method of claim 5, wherein said gaseous organic precursor compound is selected from the group consisting of aliphatic compounds having one, two, three or four carbon atoms, and aromatic compounds.

7. The method of claim 6, wherein said gaseous organic precursor compound comprises methane.

8. The method of claim 5, and further comprising the steps of:
   during said step of reacting, illuminating the workpiece with a light beam haivng a predetermined nonparallel angle to the surface of the workpiece; and
   responsive to said step of illuminating, activating illuminated portions of the workpiece surface to bond with the organic free radicals.

9. The method of claim 5, wherein said halogen free radicals comprise fluorine free radicals.

10. The method of claim 9, wherein said step of remotely manufacturing the halogen free radicals comprises:
    introducing a fluorine-bearing compound having a non-fluorine central atom and a plurality of fluorine atoms into an electromagnetic discharge reactor; and
    responsive to said step of introducing, reacting the fluorine-bearing compound with the oxygen to produce fluorine free radicals.

11. The method of claim 10, wherein said fluorine-bearing compound is selected from tetrafluoroethane, sulphur hexafluoride and mixtures hereof.

12. A process for fabricating an integrated circuit on a layer comprised of semiconductive intermetallic compound, comprising the steps of:
    introducing an X-bearing gaseous compound into a secondary reactor wherein X is selected from the group consisting of the halogens, silicon, boron, aluminum and phosphorus;
    producing X free radicals in the secondary reactor from the halogen-bearing gaseous compound;
    transmitting the X free radicals from the secondary reactor to a primary reactor containing the layer of intermetallic compound;
    introducing a gaseous hydrocarbon into the primary reactor;
    reacting the gaseous hydrocarbon with the X free radical to form an organic free radical;
    reacting the organic free radical with a selectively exposed surface of the layer to form a volatile organometallic compound; and
    removing the volatile organometallic compound to selectively etch the surface of the layer.

13. The process of claim 12, wherein said X free radicals comprise fluorine free radicals.

14. The process of claim 12, wherein said gaseous hydrocarbon comprises methane.

15. The process of claim 12, wherein said semiconductive intermetallic compound includes mercury, cadmium and tellurium.

16. A process for etching an integrated circuit workpiece layer formed of a metal, a semiconductor, metallic semiconductive compounds or mixtures thereof, comprising the steps of:
    introducing a gaseous organic free radical precursor compound of the formula $R_aX_b$ into a low pressure reactor containing the integrated circuit workpiece where R is an organo or nitro group and X is selected from the group consisting of the halogens, silicon, boron, aluminum, and phosphorus;
    illuminating a volume of the chamber with energy substantially made up of one or more wavelengths in the range of about 185 to about 1,300 nanometers;
    impinging the energy on an exposed surface of the layer;
    photodissociating an organic free radical from the gaseous organic free radical precursor compound in response to the energy;
    reacting the organic free radical with the exposed surface to create at least one volatile organometallic compound; and
    removing the volatile organometallic compound to etch the layer.

17. The process of claim 16, and further comprising the steps of maintaining the temperature of the workpiece and the chamber at a temperature of less than 100° C.

18. The process of claim 16, and further comprising the step of selecting the energy to have a wavelength which will not dissociate the volatile organometallic compound.

19. The process of claim 18, wherein said integrated circuit workpiece layer includes cadmium and R is a methyl group, said at least once volatile organometallic compound consisting essentially of dimethylcadmium, the wavelength selected to be substantially above 300 nanometers.

20. The process of claim 16, wherein said integrated circuit workpiece layer comprises an intermetallic compound.

21. The process of claim 20, and further comprising the step of reacting the organic free radical with the exposed surface to create a plurality of volatile organometallic compounds having different metal atoms.

22. A gaseous composition at a pressure of about 10 torr for etching a metallic layer on a workpiece wherein the layer comprises one or more metals forming volatile organometallic compounds, comprising:
    a quantity of halogen free radicals; and
    a quantity at least one gaseous organic free radical precursor compound capable of reacting with the halogen free radicals to produce organic free radicals for etching the layer.

23. Apparatus for etching a metallic layer on a workpiece, wherein the layer comprises one or more metals forming volatile organometallic compounds, comprising;
   a reaction chamber for receiving the workpiece;
   a vacuum source coupled to the reaction chamber for evacuating said chamber to partial vacuum;
   a secondary chamber remote from said reaction chamber for manufacturing halogen free radicals;
   means for introducing the halogen free radicals into the reaction chamber; and
   a source of a gaseous organic free radical precursor compound coupled to said chamber for introducing said organic compound therein.

24. Apparatus for etching a metallic layer on a workpiece, wherein the layer comprises one or more metals forming volatile organometallic compounds, comprising:
   a reaction chamber for receiving the workpiece;
   a vacuum source coupled to the reaction chamber for evacuating said chamber to a partial vacuum;
   a source of a gaseous organic free radical precursor compound of the formula $R_aX_b$ where R is an organo group and X is selected from the group consisting of the halogens, silicon, boron, aluminum and phosphorus, means for coupling said source of said gaseous compound to said chamber for introducing said gaseous compound therein; and
   a light source for illuminating said metallic layer and a volume of said reaction chamber adjacent said metallic layer, said light source emitting energy substantially made up of one or more wavelengths in the range of about 185 to 1,300 nanometers so as to photodissociate at least one organic free radical from said gaseous compound and so as to permit the reaction of said organic free radical with the surface of said metallic layer to form at least one volatile organometallic compound.

25. The apparatus of claim 24, and further comprising:
   a filter interposed between said light source and said volume so as to remove infrared wavelengths from said energy.

26. The apparatus of claim 25, wherein said filter comprises water.

27. A process for etching a layer of a workpiece, where the layer is composed of one or more elements and compounds forming volatile compounds of the formula $A_cB_d$, where A is an organo or nitrogen-based group, B is an inorganic group formed from the layer, and c and d are whole numbers, comprising the steps of:
   photodissociating a free radical precursor compound having an organic or nitrogen center to produce at least one gaseous free radical;
   reacting the free radical with an exposed surface of the layer to form at least one volatile $A_cB_d$ compound; and
   removing the volatile $A_cB_d$ compound from the surface.

28. The process of claim 27, wherein said free radical precursor compound has a formula $R_cX_d$ where R is an organo or amino group and X is selected from the group consisting of the halogens, silicon, boron, aluminum, phosphorus and compounds of silicon.

29. The process of claim 28, wherein said organic free radical precursor compound is methyl iodide.

30. The process of claim 28, wherein said organic free radical has the formul R.

31. The process of claim 27, and further comprising the step of illuminating the exposed surface of the layer such that the volatile $A_cB_d$ compound will be formed.

32. The process of claim 31, and further comprising the step of illuminating the exposed surface of the layer at an angle substantially perpendicular thereto.

33. The process of claim 27, wherein said step of photodissociating the free radical precursor compound comprises the step of illuminating the free radical precursor compound with electromagnetic energy selected from the waveband having a range of 185 to 1,300 nanometers.

34. The process of claim 27, wherein said layer is selected from the group consisting of metals, semiconductors and mixtures thereof.

35. The process of claim 34, wherein said layer is formed from an intermetallic compound including mercury, cadmium and tellurium.

* * * * *